United States Patent (10) Patent No.: US 9,374,054 B2
Villemoes et al. (45) Date of Patent: Jun. 21, 2016

(54) LOW DELAY REAL-TO-COMPLEX CONVERSION IN OVERLAPPING FILTER BANKS FOR PARTIALLY COMPLEX PROCESSING (71) Applicant: DOLBY INTERNATIONAL AB, Amsterdam (NL)

(72) Inventors: Lars Villemoes, Järfälla (SE); Harald Mundt, Fürth (DE)

(73) Assignee: Dolby International AB, Amsterdam, Zuidoost (NL)

( * ) Notice: Subject to any disclaimer, the term of this patent is extended or adjusted under 35 U.S.C. 154(b) by 136 days.

(21) Appl. No.: 14/380,351

(22) PCT Filed: Feb. 22, 2013

(86) PCT No.: PCT/EP2013/053607
§ 371 (c)(1),
(2) Date: Aug. 21, 2014

(87) PCT Pub. No.: WO2013/124443
PCT Pub. Date: Aug. 29, 2013

(65) Prior Publication Data
US 2015/0049880 A1 Feb. 19, 2015

Related U.S. Application Data (60) Provisional application No. 61/622,389, filed on Apr. 10, 2012, provisional application No. 61/602,848, filed on Feb. 24, 2012.

(51) Int. Cl.
*H03G 5/00* (2006.01)
*H03G 3/00* (2006.01)
*H03H 17/02* (2006.01)

(52) U.S. Cl.
CPC ............. *H03G 3/00* (2013.01); *H03H 17/0266* (2013.01)

(58) Field of Classification Search
CPC .............. H04W 48/12; H04W 72/005; H04W 72/0406; H04W 72/085; G10L 19/008; G10L 19/0204; G10L 2021/02082; G10L 25/78
USPC ......... 381/98, 119, 309, 103, 106, 23, 57, 66; 700/94; 704/225, 500, 205
See application file for complete search history.

(56) References Cited

U.S. PATENT DOCUMENTS 6,980,933 B2 * 12/2005 Cheng ................. G10L 19/0212
375/240
8,285,771 B2 * 10/2012 Ekstrand ............... G10L 19/008
708/300

(Continued)

FOREIGN PATENT DOCUMENTS

JP 2001-007769 1/2001
JP 4783377 5/2008

(Continued)

*Primary Examiner* — Lun-See Lao (57) ABSTRACT

An arrangement of overlapping filter banks comprises a synthesis stage and an analysis stage. The synthesis stage receives a first signal segmented into time blocks and outputs, based thereon, an intermediate signal to be received by the analysis stage forming the basis for the computation of a second signal segmented into time frames. In an embodiment, the synthesis stage is operable to release an approximate value of the intermediate signal in a time block located L−1 time blocks ahead of its output block, which approximate value is computed on the basis of any available time blocks of the first signal, so that the approximate value contributes, in the analysis stage, to the second signal. The delay is typically reduced by L−1 blocks. Applications include audio signal processing in general and real-to-complex conversion in particular.

21 Claims, 10 Drawing Sheets (56) References Cited

U.S. PATENT DOCUMENTS

| | | | |
|---|---|---|---|
| 8,964,998 B1* | 2/2015 | McClain | H03G 3/32 381/106 |
| 2009/0304198 A1* | 12/2009 | Herre | G10L 19/008 381/66 |
| 2010/0013987 A1* | 1/2010 | Edler | G10L 19/0204 348/425.2 |

FOREIGN PATENT DOCUMENTS

| | | |
|---|---|---|
| KR | 10-2006-0104684 | 10/2006 |
| KR | 10-2007-0001115 | 1/2007 |
| WO | 2004/013839 | 2/2004 |
| WO | 2007/031171 | 3/2007 |

* cited by examiner

Fig. 9

LOW DELAY REAL-TO-COMPLEX CONVERSION IN OVERLAPPING FILTER BANKS FOR PARTIALLY COMPLEX PROCESSING

CROSS-REFERENCE TO RELATED APPLICATIONS

This application claims the benefit of priority to U.S. Provisional Patent Application Ser. No. 61/602,848 filed on 24 Feb. 2012 and U.S. Provisional Patent Application Ser. No. 61/622,389 filed on 10 Apr. 2012, all hereby incorporated by reference in their entirety.

TECHNICAL FIELD

The invention disclosed herein generally relates to digital signal processing. More precisely, it relates to an arrangement of overlapping filter banks for processing a frequency-domain representation of one or more audio signals.

BACKGROUND OF THE INVENTION

In the field of digital signal processing, there are many applications where two filters cooperate unidirectionally or bidirectionally. In a unidirectional relationship, one filter may receive the output of the other and perform operations on this. As one example, a real-to-imaginary conversion of a frequency-domain representation of a signal may proceed as a frequency-to-time synthesis step followed by a time-to-frequency analysis. Since a transform filter by its nature introduces a non-zero delay, arrangements of two or more filters may have a considerable total delay that may in some situations pose an inconvenience. For this and other reasons, alternative solutions have been proposed, including the real-to-imaginary conversion described in the Applicant's U.S. Pat. No. 6,980,933. It would be desirable, however, to propose further alternatives in addition to this approach.

BRIEF DESCRIPTION OF THE DRAWINGS

Embodiments of the invention will now be described with reference to the accompanying drawings, on which:

FIG. 3b shows an example analysis window to be applied in connection with the processing illustrated in FIG. 3a;

All the figures are schematic and generally only show parts which are necessary in order to elucidate the invention, whereas other parts may be omitted or merely suggested. Unless otherwise indicated, like reference numerals refer to like parts in different figures.

DESCRIPTION OF EMBODIMENTS OF THE INVENTION

I. Overview

The present invention proposes, inter alia, methods and devices enabling efficient real-to-imaginary operation on coefficients in a frequency-domain representation of an audio signal. The real-to-imaginary operation may proceed via a frequency-to-time synthesis step followed by a time-to-frequency analysis. Example embodiments of the invention provide a method for providing a partially complex frequency-domain representation of an audio signal on the basis of a real frequency-domain representation of the signal, as well as an audio processing system and a computer-program product for performing this method, with the features set forth in the independent claims.

A first example embodiment of the invention provides an audio processing system generally comprising the following components:

a synthesis stage,
an analysis stage communicatively connected to the output of the synthesis stage, and
a processor.

Both the processor and the synthesis stage receive a first subband range of a first frequency-domain representation of a signal as input. The processor combines the first frequency-domain representation and the output of the analysis stage to form a complex frequency-domain representation of the signal in the first subband range. The processor may further receive a frequency-domain representation of a second subband range of the signal as input, whereby the processor may be configured to combine both representations of the signal in the first subband range and the second subband range of the signal into a partially complex frequency-domain representation of the signal. Preferably, the second subband range is the complement of the first subband range, so that the two ranges exhaust the first frequency-domain representation of the signal.

The output of the analysis stage is referred to as a second frequency-domain representation of the signal. Each frequency-domain representation is segmented into time blocks (or time slots) comprising a number N of samples. The number of samples per block may be variable. Preferably however, there are a fixed number of samples per block. The first frequency-domain representation is further segmented into first spectral components representing spectral content of the signal in the first subband range expressed in a first subspace of a multidimensional space. The second frequency-domain representation is segmented into second spectral components representing spectral content of the signal in the first subband range expressed in a second subspace of the multidimensional space that includes a portion of the multidimensional space not included in the first subspace. The first and second frequency-domain representations may be a sine and a cosine representation or vice versa.

In this first example embodiment, the synthesis stage permits the analysis stage to access an approximate value of the intermediate time-domain representation in a time block located $d_1 \geq 1$ time blocks ahead of its output time block. The approximate value is computed on the basis of any available time blocks of the first frequency-domain representation, other time blocks being replaced by a default time block, such as a time block having all its samples equal to zero or to a neutral value representing no signal energy (no sensor excitation). As used herein, at a given point in time, the output time block of the synthesis stage is the earliest time block in which a set of time blocks of the first frequency-domain representation, which set is sufficient for an exact computation of the same (i.e., earliest) time block, would have been available in normal operation of the synthesis stage. In other words, it will be possible to refine the approximate value into an exact value of the same quantity (time block) after a time corresponding to $d_1$ time blocks have elapsed supposing time blocks of the first frequency-domain representation are received in the normal or expected way. With the data available at this point in time, it will also be possible to calculate the exact value a priori instead of refining an available approximate value. Clearly, variations of this example embodiment may be configured to output two or more approximate values, such as approximate values of a sequence of time blocks.

In this first embodiment, further, the said approximate value contributes to the second frequency-domain representation of the signal, insofar as the analysis stage uses the approximate value as an input or one of a plurality of inputs for computing the second frequency-domain representation. This means that the analysis stage is able to compute a given time block of the second frequency-domain representation at least one time block earlier, which reduces the pass-through time of the multiband filter.

In an example embodiment, the synthesis stage is a FIR filter impulse response $[h_0\ h_1\ h_2\ \ldots\ h_{L_S}]$, where each coefficient is an N-vector of consecutive values. Based on an input sequence $[x_0\ x_1\ \ldots\ x_n]$, the FIR filter outputs an output time block $$y_n = \sum_{i=0}^{l_S-1} h_i \circ x_{n-i}^{(i)}.$$

Here, $\circ$ denotes element-wise matrix multiplication (Hadamard product), and the summation is element-wise too. The N-vectors $x_n^{(i)}$ are formed from sub-blocks of $x_n$. It is assumed that the FIR filter is non-trivial in the sense that the first coefficient block is non-zero, $h_0 \neq (0, 0, \ldots, 0)$, so that the output time block $y_n$ cannot be computed until the youngest input time block $x_n$ has been input. This is to say, the FIR filter is of order $L_S$.

In a further development of the previous example embodiment, the FIR filter comprises one or more output buffers for storing approximate values of different time blocks of the intermediate time-domain representation. The buffers are updated on every occasion that the FIR filter receives a new time block of the first frequency-domain representation of the signal. The update consists in incrementing the buffer value by the new time block pre-multiplied with the relevant impulse response coefficients. (As used in this disclosure, pre-multiplication does not refer to an intended order of the value block and the coefficient blocks; indeed, element-wise multiplication is a commutative operation.) Hence, buffers having received a relatively greater number of updates store more reliable approximate values than buffers having received a relatively smaller number of updates. After a buffer has undergone the full number $L_S+1$ of updates after the latest reset (or flush), it contains the exact value of the concerned time block. In this embodiment, however, the approximate value of the time block is released after only $L_S+1-d_1$ updates. In other words, the contributions from the remaining, not yet available time frames are as if these time frames were set to zero.

In an example embodiment, the FIR filter comprises one or more input buffers for storing received recent time blocks of the first frequency-domain representation. A weighted summer is responsible for producing an approximate value of a time block located $d_1$ time blocks ahead of its normal output time. To this end, the weighted summer retrieves $L_S+1-d_1$ buffer values, pre-multiplies these by the corresponding coefficient blocks (of impulse response coefficients) and sums the results in an element-wise fashion.

In an example embodiment, the accurateness of the computation of the approximate value is ensured by requiring that it includes applying impulse response coefficient blocks representing at least 50% of the total impulse response mass. Hence, supposing coefficients $[h_p\ h_{p+1}\ h_{p+2}\ \ldots\ h_{L_S}]$ are used in order to compute the approximate value, then, preferably $$\frac{\sum_{i=p}^{L_S} |h_i|}{\sum_{i=0}^{L_S} |h_i|} \geq 0.5.$$

A higher percentage will in normal circumstances increase the accuracy. Preferably, the total mass of the coefficient blocks applied is at least 60%, 70% or 80% of the total mass. Here, p is a number which depends on $d_1$. In some embodiments, one may have $p=d_1$.

In a variation to the preceding example embodiment, the impulse response coefficient blocks applied in order to compute the approximate value constitute a sequence of consecutive time blocks that includes the local absolute maximum of the impulse response. The absolute maximum may refer to the coefficient block with the greatest mass or the coefficient block containing the single coefficient with the greatest absolute value.

In example embodiments, the analysis stage comprises a FIR filter sharing the structural and/or functional features described hereinabove in connection with the synthesis stage.

In an example embodiment, the audio processing system comprises at least one delay line arranged between the input point of the multiband filter and the input of the processor for forming the partially complex frequency-domain representation of the signal. The one or more delay lines facilitate the formation of the partially complex frequency-domain representation by ensuring synchronicity. The delay may be achieved by a technique known per se in the art, e.g., temporary storage, time stamping and/or inclusion into a compound data structure.

The dependent claims define further example embodiments of the invention. It is noted that the invention relates to all combinations of features, even if these are recited in different claims.

II. Example Embodiments

Figure 6A:
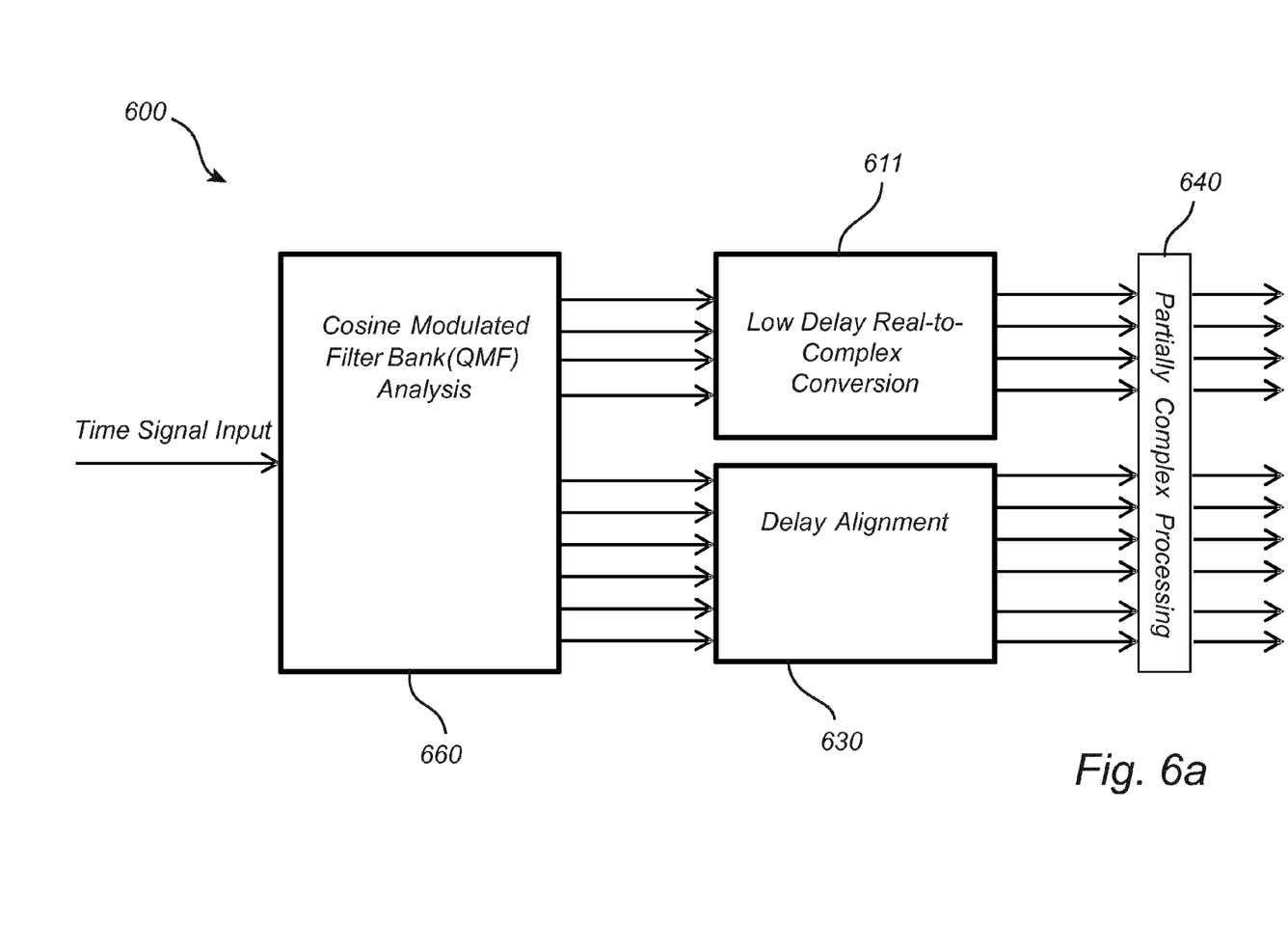
FIGS. 6, 7 and 8 show audio processing systems in which embodiments of the invention may be deployed.

FIG. 6a is an overview in block-diagram form of a signal processing system 600 in which embodiments of the present invention may be deployed. Starting from the left, a time signal (e.g., a time-domain representation of an audio signal obtained by letting an acoustic wave excite an acoustic transducer which outputs a digital signal) is supplied to a cosine-modulated filter bank 660, which may be of a QMF or pseudo-QMF type. The filter bank 660 provides as many output signals as it has frequency bands (or frequency bins). Since the filter bank 660 is cosine-modulated, the output signals are conventionally referred to as real spectral components. Both the input time signal and the output frequency signals may be segmented into time blocks and/or into one or more channels. Out of the output signals from the filter bank 660, a first subset is supplied to a real-to-complex conversion stage 611, which converts the real spectral components into complex spectral components by adding an imaginary part corresponding to a sine-modulation of the original time signal. The complex spectral coefficients are supplied to a partially complex processing stage 640. The remaining output signals (second subset) from the filter bank 660 are delayed in a delay line 630 in order to arrive at the partially complex processing stage 640 in synchronicity with the complex spectral components in the first subset. The first and second subsets form a partially complex frequency-domain representation of the original signal, which may undergo application-specific processing in the processing stage 640. The application-specific processing may include operations known or expected to involve aliasing problems (or other difficulties arising in connection with processing of critically sampled signals) in the frequency range that corresponds to the first subset of frequency bands. Because the frequency-domain representation includes full complex spectral coefficients in this frequency range, a processing scheme with these properties will typically be less sensitive to aliasing problems and/or artefacts that may otherwise reduce the perceived quality of an audio or video signal.

Figure 6B:
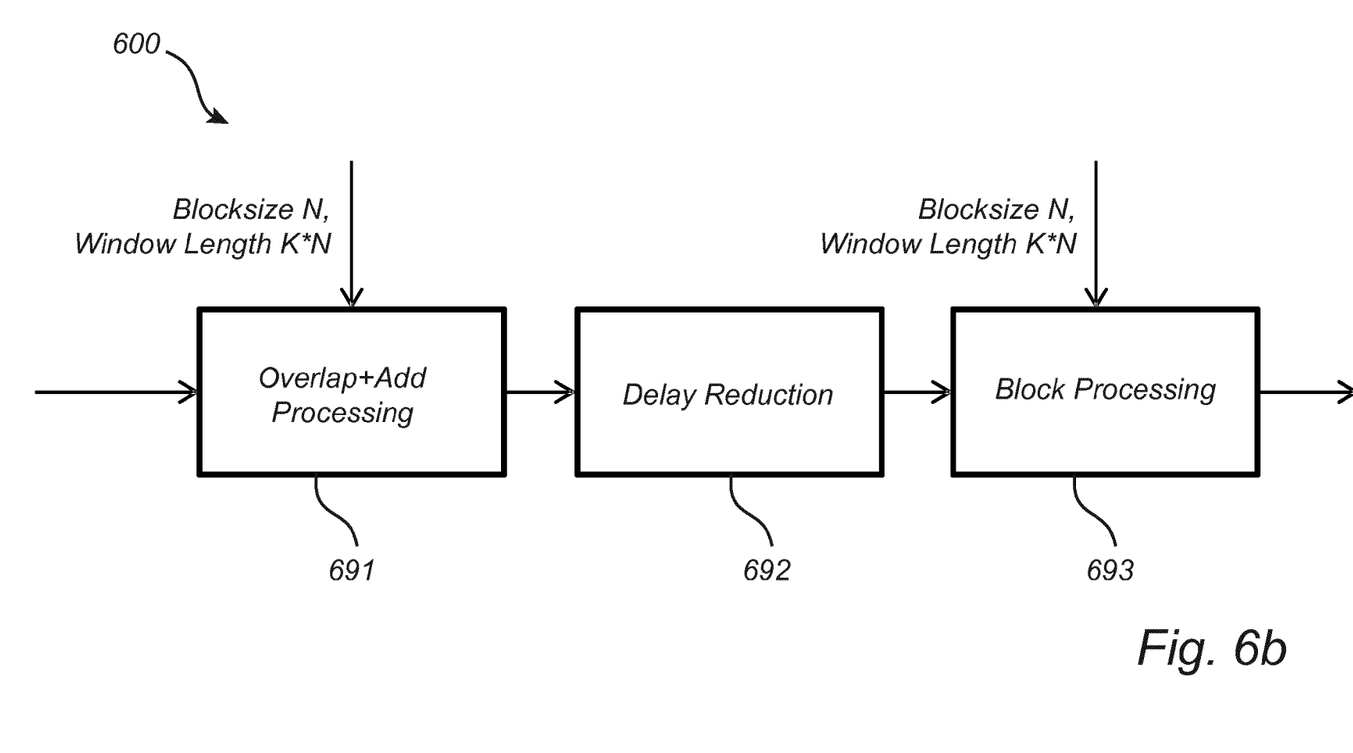

The audio system 600 may be described on a more abstract level, as in FIG. 6*b*, wherein an overlap-and-add processing stage 691 is succeeded by a block processing stage 693 located downstream thereof. Assuming a constant block size of N samples, the overlap-and-add processing 691 includes forming subsequences of K consecutive blocks each (comprising K×N samples) and applying a windowing function to these. Successive windows overlap, so that a given block will be included in more than one window, at different positions with respect to the windowing function. Consecutive windows are superimposed and added to obtain blocks of the intermediate signal, which implies that a given block of the intermediate signal will not be exactly known until the input signal has progressed so far that all input blocks that contribute, via the time windows they form part of, are available. In the block processing stage 693, subsequences of K' consecutive blocks (K'×N samples each) of the intermediate signal are used as input to a processing operation having one block (N samples) as output. The number K of blocks processed simultaneously by the overlap-and-add processing stage 691 may be different from the number K' of blocks processed in the block processing stage 693 (cf. FIG. 3*a*). Alternatively, these numbers may be equal, K=K' (cf. FIG. 6). The block processing may be a polyphase implementation of a subsampled uniformly modulated filter bank. One block of output data will be finished until when the contribution of future blocks is zero due to the finite window length. Put differently, every output block of N samples is calculated from K'×N input samples (window length), and for every N input samples there are N (finished) output samples.

One aspect of the invention relates to a delay reduction stage 692 located between the overlap-and-add processing stage 691 and the block processing stage 693. The delay reduction stage 692 forwards approximations of blocks of the intermediate signal from the overlap-and-add processing stage 691 to the block processing stage 693, which therefore may initiate processing of a given block earlier than if it had used its exact value. In such implementations where the overlap-and-add processing 691 involves successive increments of a memory portion that will, over time, contain approximations that gradually (though not necessarily monotonically) approach the exact value of a given output block, the delay reduction stage 692 may be configured to make some of these approximations available to the block processing stage 693. In other words, approximate values that in conventional implementations remain internally accessible to the overlap-and-add processing stage 691 only are selectively forwarded by the delay reduction stage 692 to the block processing stage 693.

Figure 7:
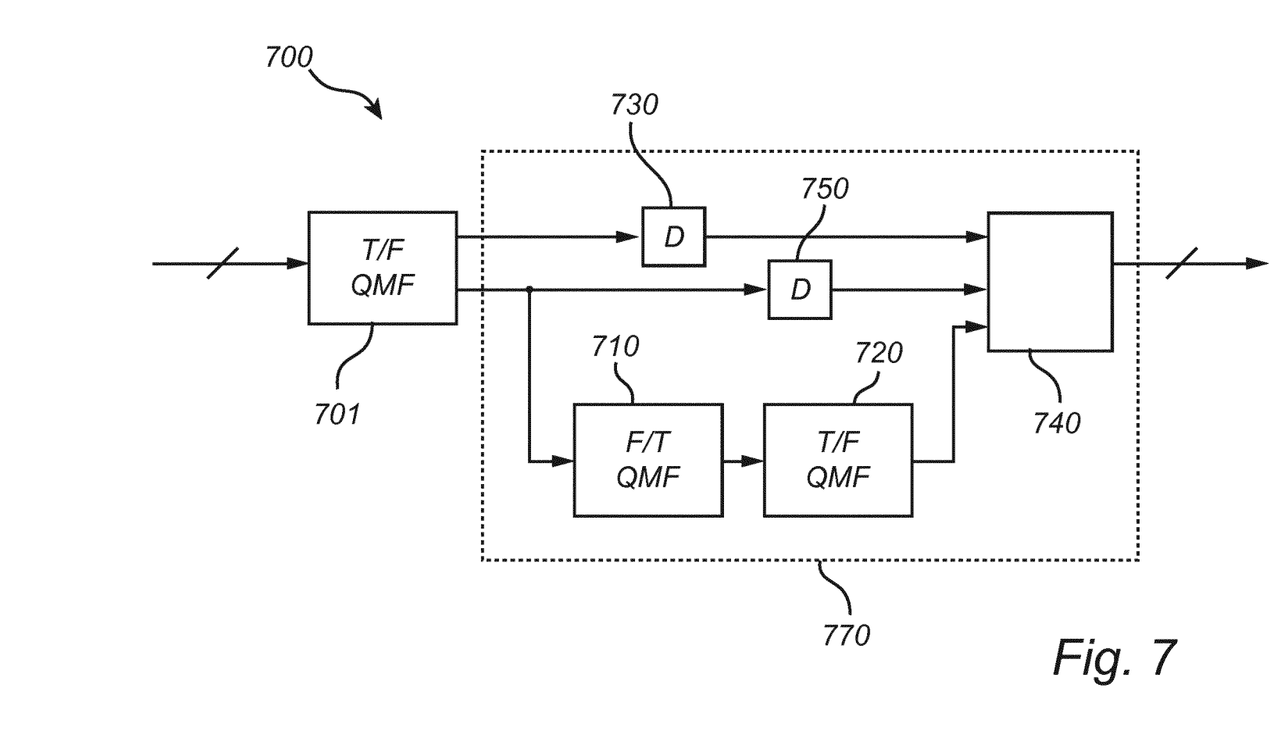

FIG. 7 is a generalized block diagram showing an audio processing system 700 having a multiband filter 770 in accordance with an example embodiment of the present invention. In the multiband filter 770 receives a real frequency-domain representation of an audio signal and outputs a partially complex frequency-domain representation of the signal. In the multiband filter 770, there are in essence two parallel processing paths, out of which a first processing path is responsible for the treatment of a first subband range (which may be represented by spectral components relating to a first subset of frequency bins) and a second processing path is responsible for a second subband range. In FIG. 7, the second processing path is represented by the top input line to a processor 740, namely a delay line 730. The first processing path, as represented by the lower lines extending up to the processor 740, is further subdivided into two parallel paths, out of one path is a pure delay line 750, so that the processor 740 will receive both a non-processed copy of the first subband range of the frequency-domain representation of the audio signal and a processed copy of the same signal, however delayed to such extent that it is received synchronously by processor 740. The processed copy of the signal is obtained by real-to-imaginary conversion implemented by as successive stages of frequency-to-time synthesis 710 and time-to-frequency analysis 720. Hence, from the original frequency-domain representation of the audio signal, which related to real (e.g., cosine-modulated) spectral components, there is obtained, via an intermediate time-domain representation, a representation with imaginary (e.g., sine-modulated) components. In an alternative example embodiment, the synthesis stage 710 receives an imaginary representation and the analysis stage 720 outputs a real representation. In either case, the processor 740 is configured to combine corresponding imaginary spectral components and real spectral components, wherein either is received from the delay line 750, so as to obtain a complex representation of the audio signal in the first subband range. The complex representation is further combined, in the processor 740, with the non-processed representation of the second subband range obtained from delay line 730, so that a partially complex representation is obtained at the output of the processor 740.

The synthesis 710 and analysis 720 stages may be implemented as successive instances of overlap-and-add processing and (windowed) block processing, to which the invention may be applied, as follows. Operated conventionally, the analysis stage 720 performs block processing to compute an output time block on the basis of exact values of K input time blocks. According to an example embodiment, the analysis stage 720 bases the computation on approximate values of L≥1 time blocks and exact values of K−L blocks of the intermediate time-domain signal. To enable this, the synthesis stage 710 releases the approximate values, which have been computed on the basis of any available time blocks of the first subband range of the first frequency-domain representation, for use by the analysis stage 720. This way, the analysis stage 720 may initiate the computations leading up to a given output time frame at an earlier point in time. Because an output time frame is based in part on the approximate values of the L time blocks, its accuracy and/or reliability decreases to some extent. There is typically an inverse relationship between the output accuracy and the number L of approximate time blocks having replaced exact time blocks.

An overlapped filter bank operation representing an example embodiment of the invention will now be described on a more specific level, wherein the signals are modelled as functions of discrete time. It is recalled that this example embodiment and its mathematical description are intended to elucidate the invention from a new angle rather than limiting its scope; having studied and understood the description of this example embodiment, the skilled person will be able to propose further embodiments which may differ with respect to the notation used, the distribution and order of certain computational tasks but which still utilize the non-generic ideas from the described example embodiment, such as the use of approximate values as input to the second filter bank.

The time stride is N and the overlap factor given by the integer $K>1$. (Hence $K=L_S+1$) The discrete time variable is t. The synthesis window (or prototype filter) h(t) of length NK samples is assumed to be zero outside the time interval $\{0, 1, \ldots, NK-1\}$. For the $k^{th}$ time slot (or time frame) of the filter bank, a signal $x_k(t)$ with support length NK is produced from a vector of subband samples. The operations involved are typically a frequency-to-time transform followed by extensions based on repetition and time flips. It is assumed that the signal $x_k(t)$ is zero outside the time interval $\{0, 1, \ldots, NK-1\}$.

The full synthesis to a time domain output y(t) is described by $$y(t) = \sum_{k=-\infty}^{+\infty} x_k(t-Nk)h(t-Nk).$$

Due to the overlap, there are K contributions to each output value. The partial synthesis that can be created from the time slots with $k \leq n$ is $$y_n(t) = \sum_{k=-\infty}^{n} x_k(t-Nk)h(t-Nk).$$

The difference between the full and the partial synthesis is $$y(t) - y_n(t) = \sum_{k=n+1}^{+\infty} x_k(t-Nk)h(t-Nk),$$

and one observes that this sum, in the generic case, vanishes if and only if $t<N(n+1)$. This means that the fully synthesized output is available from $y_n(t)=y(t)$ only up to the sample with time index $t=N(n+1)-1$.

The analysis filter bank operation is based on a window g(t) which is assumed here for simplicity to have the same support as h(t) (K=K'). At time slot m, a signal to be analyzed is considered on the interval $\{Nm, Nm+1, \ldots, N(m+K)-1\}$ and is loaded into an analysis buffer. For the case of the signal $y_n(t)$, this analysis buffer is $a(t)=y_n(t+Nm), t \in \{0,1,\ldots,NK-1\}$ This buffer is subsequently windowed by g(t):

$a(t)g(t), t \in \{0,1,\ldots,NK-1\},$ and the windowed buffer is then subject to a time-to-frequency transform. Typically, the NK time samples are transformed into N frequency-domain samples by means of a modulation matrix, the structure of which lends itself to an efficient stepwise implementation. This involves a first step of periodization and fold-in operations that provides a smaller time sample block and a fast transform on this smaller block. The result is the frequency domain vector representing the $m^{th}$ time slot of the analysis.

For the buffer a(t) to consist of a segment of a fully synthesized signal $a(t)=y(t+Nm)$, it is necessary that $n+1 \geq m+K$. This means that the input slots up to $n=m+K-1$ has to be processed by the synthesis filter bank, in order to be able to access slot m of the subsequent analysis. This imposes a reference delay of $K-1$ slots in this model system of synthesis followed by analysis.

By this example embodiment, an adequate approximation of the analysis can be obtained with a reduced delay. The approximate analysis buffer â(t) extracts a partially reconstructed signal with $n=m+K-1-p$, namely $â(t)=y_{m+K-1-p}(t+Nm), t \in \{0,1,\ldots,NK-1\},$ where $p \geq 1$ is the delay reduction in slots relative to the reference case where $p=0$ and $n=m+K-1$. Upon analysis windowing with g(t), the error introduced in the approximate analysis is $$[a(t) - â(t)]g(t) = \sum_{k=m+K-p}^{m+K-1} x_k(t+Nm-Nk)h(t+Nm-Nk)g(t)$$

$$= \sum_{l=K-p}^{K-1} x_k(t-Nl)h(t-Nl)g(t).$$

This error is small when the products of shifted windows h(t−Nl)g(t) for $l \geq K-p$ are small. In a preferred embodiment, the values are K=10 and p=4, and the product of shifted windows is negligible for $l \geq 6$.

With explicit reference to the slot index m, the update of a conventional analysis buffer a(t) can be described as follows.

$$a_m(t) = \begin{cases} a_{m-1}(t+N), & t \in \{0, 1, \ldots, N(K-1)-1\}; \text{ (shift)} \\ y_{m+K-1}(t+Nm), & t \in \{N(K-1), \ldots, NK-1\}. \text{ (read)} \end{cases}$$

In other words, the least recent time slot is erased at a first end of the buffer, one time slot is copied from the synthesis into the second end of the buffer, and content relating to intermediate frames in the analysis buffer is shifted towards the first end. (The reference to "ends" is purely conceptual, and it is envisaged in specific implementations that a circular buffer is used or a buffer is provided with virtual circularity achieved through appropriate pointer addressing.) The analysis buffer according to this embodiment is updated with a larger proportion of reading from the synthesis, namely:

$$â_m(t) = \begin{cases} â_{m-1}(t+N), & t \in \{0, 1, \ldots, N(K-1-p)-1\}; \text{ (shift)} \\ y_{m+K-1-p}(t+Nm), & t \in \{N(K-1-p), \ldots, NK-1\}. \text{ (read)} \end{cases}$$

The synthesis buffer for time slot index n is $s_n(t)=y_n(t+Nn), t \in \{0,1,\ldots,NK-1\}$ The update of this buffer is the same for the standard and the inventive case, namely:

$$s_n(t) = \begin{cases} s_{n-1}(t+N) + x_n(t)h(t), & t \in \{0, 1, \ldots, N(K-1)-1\}; \quad \text{(shift and add)} \\ x_n(t)h(t), & t \in \{N(K-1), \ldots, NK-1\}. \quad \text{(update)} \end{cases}$$

Hence, this example embodiment differs from the conventional technique referred to above in that a greater portion than just the content of the first time block $\{0, 1, \ldots, N-1\}$ of the synthesis buffer is made available to the subsequent analysis stage.

Figure 3A:
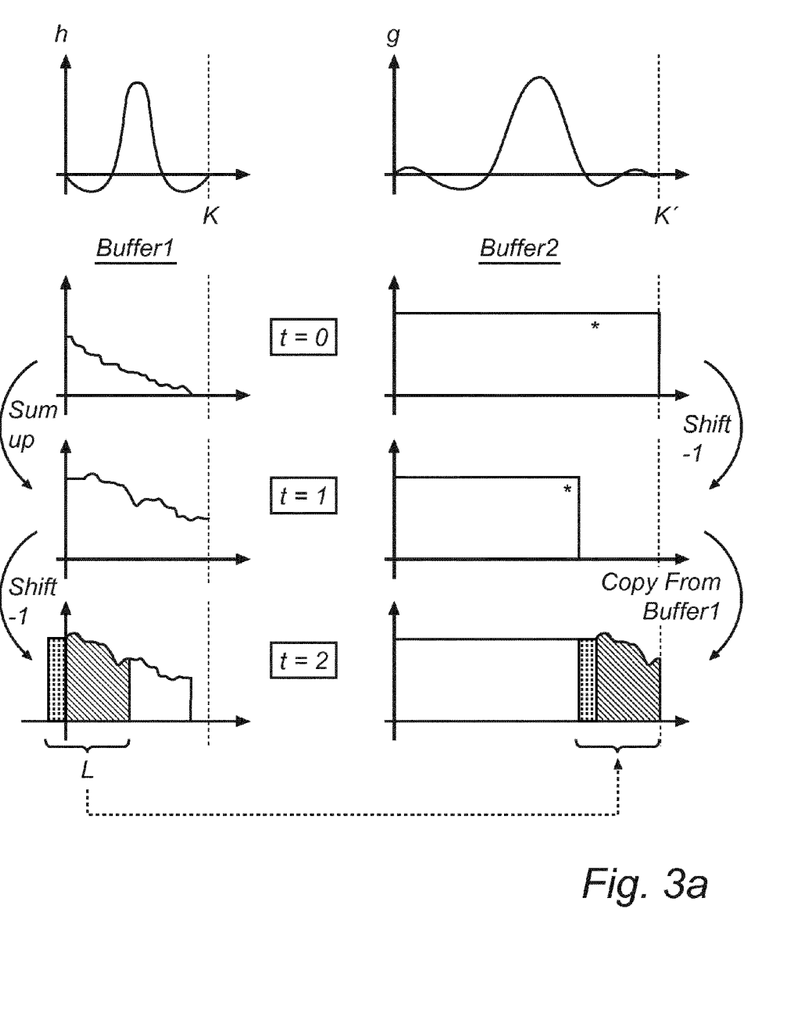
FIG. 3a is a simplified signal diagram showing, at different points in time, the content of two buffers producing an intermediate signal (y) based on an input signal and further producing an output signal based on the intermediate signal.

FIG. 3a illustrates buffer contents in an arrangement of two cooperating filters, a first (synthesis) filter comprising $K = L_S + 1$ taps (for providing an intermediate signal y on the basis of an input signal x) and a second (analysis) filter comprising $K' = L_A + 1$ taps (for providing an output signal z on the basis of the intermediate signal y). The signals are drawn as at three different points in time. Here, white colour indicates already present data (from a preceding iteration), lighter shading indicates new approximate data and darker shading indicates new exact data.

Figure 3B:
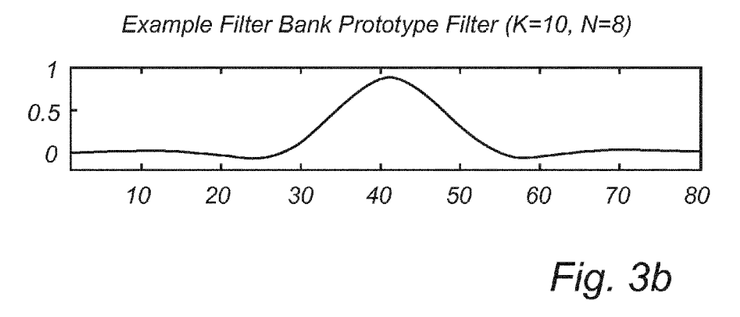

The first filter, associated with prototype filter (impulse response) h, is configured to replace its last $d_1 = L - 1$ input time blocks by zero blocks, so that its L−1 most recent output blocks will consist of approximate values. FIG. 3b shows a realistic example prototype filter for a block size of N=8 samples and a window length of K=10 blocks. The second filter, which is associated with prototype filter g, is configured to use the L−1 last output blocks from the first filter. The total delay of the filter arrangement is reduced by L−1 blocks. In a reference implementation with non-symmetric prototypes, the delay decreases from $L_S + L_A + 1 = K + K' - 1$ blocks to K+K'−L blocks. The prototype filters g and h are drawn in FIG. 3a on the same time scale as the buffers.

Between t=0 and t=1, the synthesis buffer (Buffer1) in the first filter is incremented by a frame of data that includes a most recent time block. At time t=1, then, the least recent time block (to the very left) contains exact intermediate signal data, ready to be output in a conventional filter. Between t=1 and t=2, the L least recent time blocks are copied from the synthesis buffer to the analysis buffer (Buffer2) in the second filter, and the content of the synthesis buffer is shifted by one time block. The analysis buffer is prepared for receiving the copied time blocks from the synthesis buffer by being shifted, between t=0 and t=1, by one block (cf. reference mark) while an additional L−1 blocks of data are discarded or labelled as free to be overwritten. At t=1, there will be L available time block spaces in the analysis buffer.

In a variation hereto, wherein the accuracy is somewhat reduced in order to further reduce the total delay, the second filter may use as input blocks exact old and new output blocks from the first filter (least recent portion of input), approximate output blocks from the first filter (intermediate portion) and, in addition to this, $d_2$ blocks of zeros (most recent portion). For each additional block of zeros that is used as input, the total delay will decrease by one time block. This approach may be said to distribute the delay reduction efforts over both filters. It may involve a potential benefit insofar as the loss of accuracy is smaller than in a case where the delay reduction affects one filter only, e.g., by setting $d_2 = 0$ and $d_1$ to an excessive value.

Figure 9:
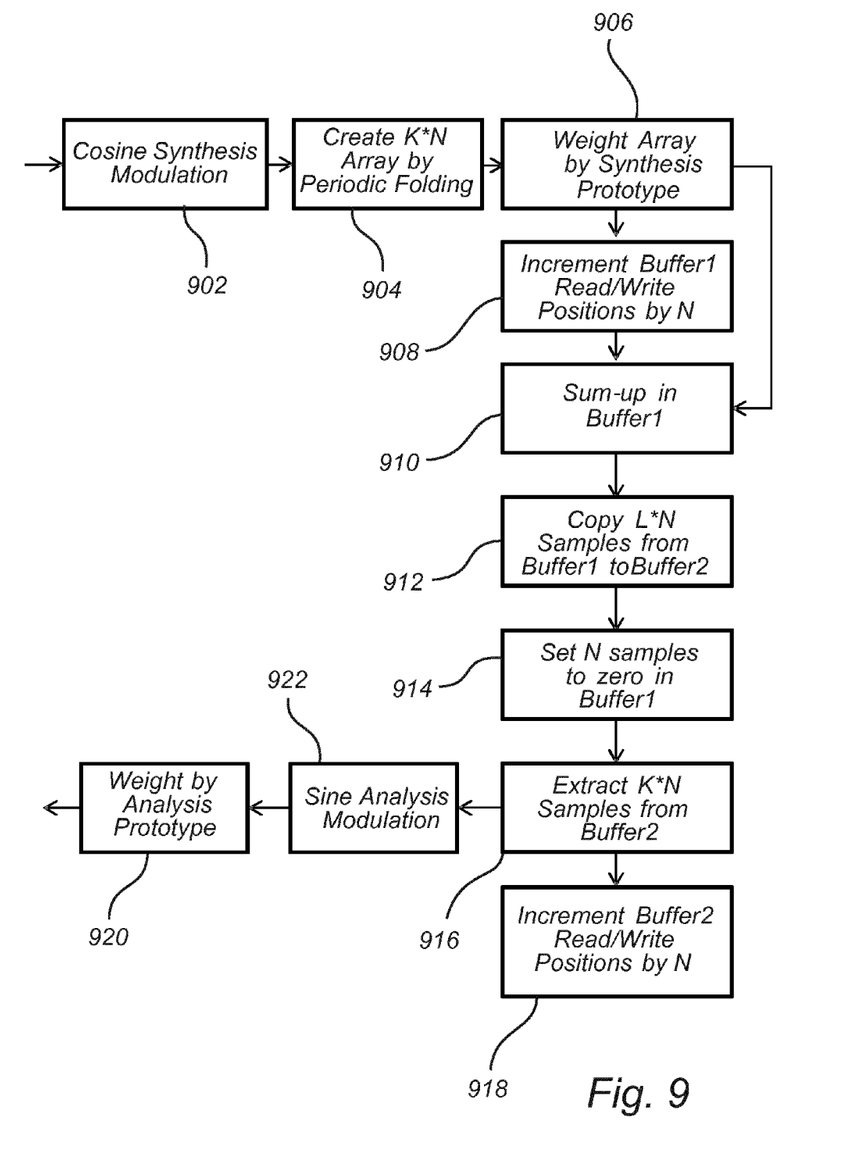
FIG. 9 is a flowchart of an audio processing method in accordance with an embodiment of the invention.

FIG. 9 is a flow chart illustrating an iteration of operations to be performed on an audio signal, in accordance with an example embodiment. During these operations, a buffer handling technique reduces the delay in two cooperating filter banks, a synthesis filter bank associated with a synthesis buffer (Buffer1) and an analysis filter bank associated with an analysis buffer (Buffer2). The synthesis filter bank operates by initiating a location in Buffer1 and then incrementing its contents by weighted new signal values, preferably in a block-wise fashion, until the buffer contains exact result data ready to be output. The processing in the analysis filter bank may correspond to the sequence of polyphase filtering (windowing) and modulation matrix operation and takes its input values from Buffer2.

It is noted that the buffers are circular buffers of length K×N, N being the block size, and the initial read/write positions are as shown in Table 1.

TABLE 1

| Initial read/write positions in buffers | | |
| --- | --- | --- |
| Buffer1 | read | 0 |
|  | write | 0 |
| Buffer2 | read | 0 |
|  | write | (K − L) × N |

The number L will be defined below. It is pointed out, further, that the flowchart illustrates a 'warm start' situation, in which the buffers contain values resulting from processing in previous iterations.

In a first step 902, a new block of time samples from a cosine modulated frequency-domain representation of the audio signal is obtained using cosine (de-) modulation. In a second step 904, an array of K time blocks is formed by folding the new block of N time samples K times periodically and weighting, in a third step 906, by a synthesis prototype of the general type shown in FIG. 3b. Next, in a fourth and fifth step 908, 910, read/write positions (pointers) in Buffer1 are incremented by N (wherein overflow values wrap around by virtue of the circularity) and the windowed K-block array is added to the values already present in Buffer1. After these steps, Buffer1 will contain one block of exact values and K−1 blocks of values obtained by different approximations. In a sixth step 912, a number L≥2 of blocks are copied from Buffer1 to Buffer2 (overwriting the previous content in Buffer2), so that at least one approximate block will contribute to the analysis filtering, leading to a delay reduction by (L−1)×N samples. The iteration continues, in a seventh step 914, by resetting N samples in Buffer1; the location of the reset N samples in the buffer will, after the fifth step of the next iteration, contain the most rudimentary approximation. Subsequently, the analysis filter processes the copied L blocks together with K−L existing blocks, to obtain a block of a frequency-domain representation of the audio signal. More precisely, in an eighth, ninth and tenth step 916, 920, 922, K blocks are extracted from Buffer2, weighted by the analysis prototype and then processed into a block of the frequency-domain representation of the audio signal by a sine modulation matrix operation. In a final eleventh step 918, the read and write positions referring to Buffer2 are incremented by N samples each. This completes the iteration, and the filter banks may proceed to a subsequent iteration.

As the skilled person will realize after reading the discussion relating to FIG. 9, it is possible to modify the algorithm in a number of ways while still achieving the same result. For instance, the handling of the buffer read/write positions may be performed in a different order, as also illustrated by the double arrows leaving the boxes representing the third and eighth steps 906, 916; the order of these operations is not critical to the algorithm as long as selections are made consistently in all iterations.

Figure 8A:
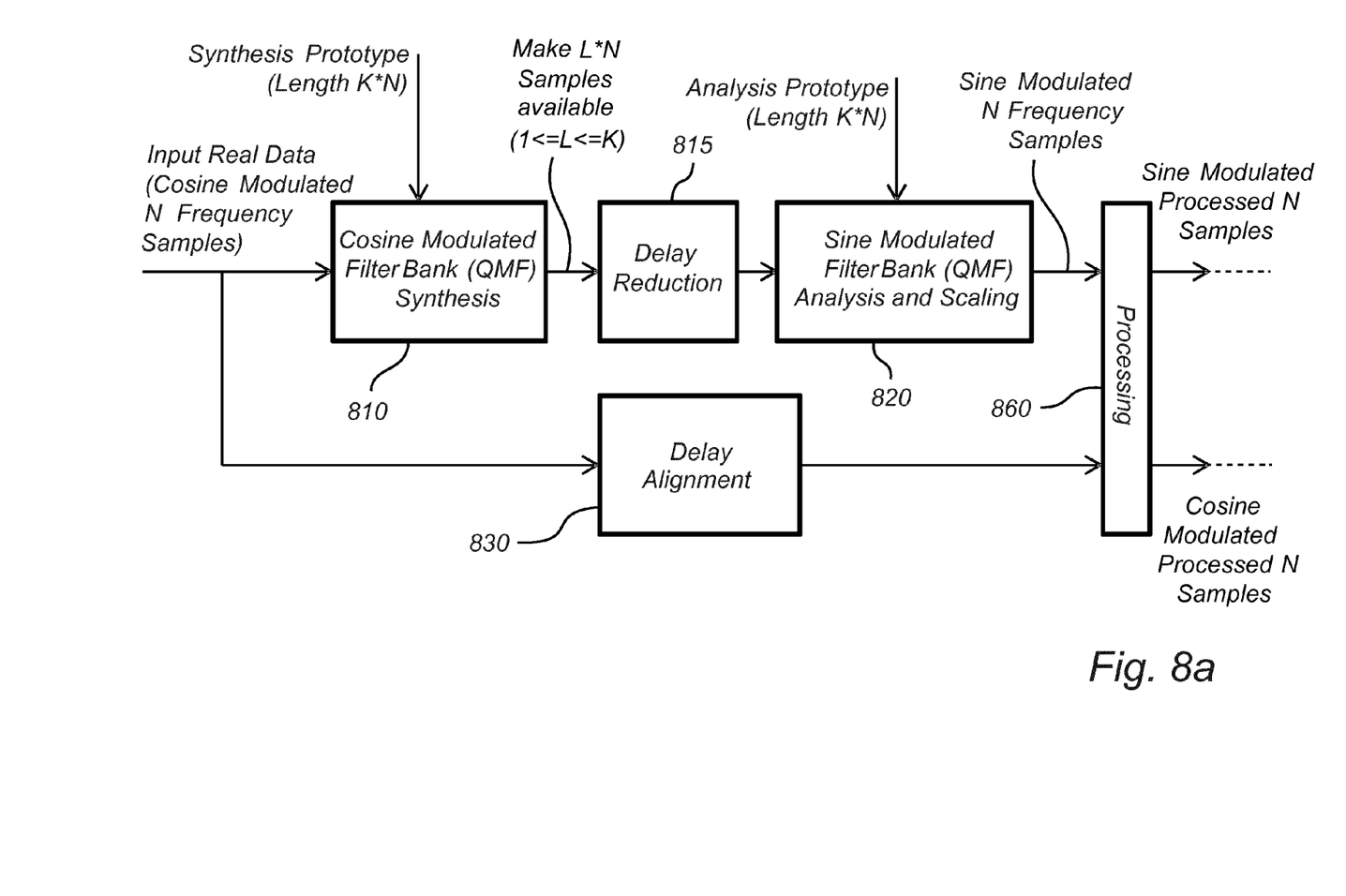

FIG. 8a shows a structure in which the algorithm of FIG. 9 may be carried out. Together, FIGS. 8a and 8b also illustrate a processing architecture that may potentially benefit from the present invention. Reference is generally made to FIG. 7, which illustrates an audio processing system 700 that is similar in structure and function. In FIG. 8a, between the left input point and the inputs to processing stage 860, the signals undergo conversion from a pure real frequency-domain representation into a partially complex representation. As in the processing system 700, the imaginary frequency-domain representation to be added to the pure real frequency-domain representation are obtained by synthesis followed by analysis, in filter banks 810, 820, and a delay reduction stage 815 makes approximate synthesis values available for use by the analysis filterbank 820. Delay stage 830 ensures that the non-processed pure real frequency-domain representation is supplied to the processing stage 860 in synchronicity with the processing results. The processing stage 860, then, performs application-specific processing, e.g., processing intended to produce a desired effect in a particular use case. Because the processing stage 860 operates on the basis of an enriched, partially complex representation of the signal, there is good robustness to aliasing, and so the nature of the application-specific processing may be diverse. The processing stage 860 may operate on one time block (N samples) at a time or on many time blocks.

Figure 8B:
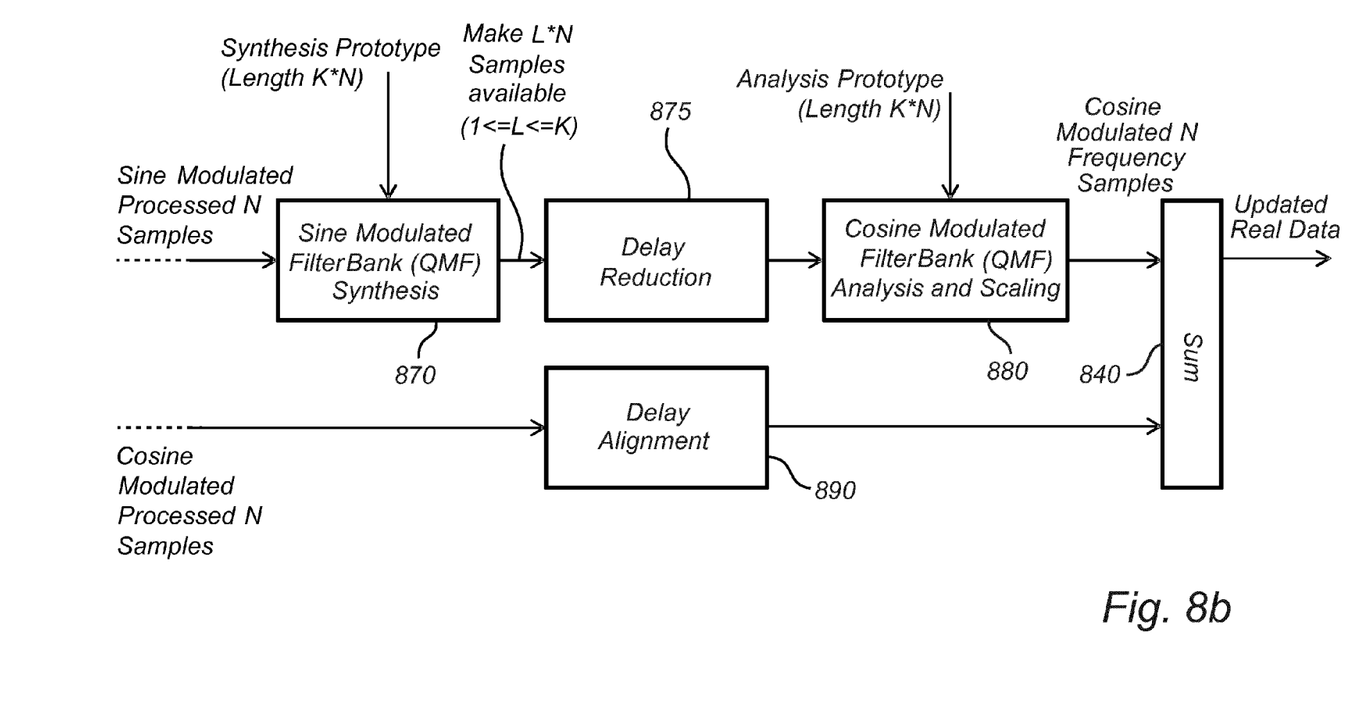

FIG. 8b indicates a possible downstream portion of the components shown in FIG. 8a. The portion shown in FIG. 8b achieves complex-to-real conversion of the frequency-domain representation of the audio signal after processing by the processing stage 860. As such, a synthesis filter bank 870 and a downstream analysis filter bank 880 perform imaginary-to-real conversion on that portion of the spectrum where the audio signal is represented by imaginary spectral data in addition to the real spectral data. More precisely, if the portion in FIG. 8a contained a cosine-modulated synthesis filter 810 followed by a sine-modulated analysis filter 820, the portion in FIG. 8b will contain a sine-modulated synthesis filter bank 870 followed by a cosine-modulate analysis filter bank 880. The analysis filterbank 880 in FIG. 8b may further effect a rescaling of the spectral data, so that the real spectral data obtained in this manner becomes comparable to real spectral data forwarded from the processing stage 860 by a delay line 890. This allows a subsequent summation stage 840 to update the real data in the representation of the processed audio signal, in such manner that any undesirable aliasing side-effects may be removed from the signal. Unlike the filter banks 810, 820, 870, 880, the summation stage 840 may operate on a single time block at a time. In this example embodiment, the consecutive filter banks 870, 880 in FIG. 8b are subject to delay reduction 875, namely by making approximate outputs from the synthesis filter bank 870 available to the analysis filter bank 880.

Finally, a few example FIR filter implementations will be discussed with reference to FIGS. 1, 2, 4 and 5. Like the Overview section above, these figures will use block-oriented notation, which is related to the time-dependent notation as follows. The symbol $\tilde{y}_n$ denotes the matrix block formed by all samples $y(t+Nn)$ with $t \in \{0, 1, \ldots, N-1\}$. In a similar manner, by letting $t \in \{0, 1, \ldots, N-1\}$, the block $h_i$ is formed from $h(t+Ni)$ and the block $x_n^{(i)}$ is formed from $x_n(t+Ni)$. Using this notation, one has $$\tilde{y}_n = \sum_{i=0}^{K-1} h_i \circ x_{n-i}^{(i)}.$$

Further, $\tilde{y}'_n, \tilde{y}''_n, \tilde{y}_n^{(3)}, \ldots,$ denote approximate blocks given, for $p \geq 1$, by $$\tilde{y}_n^{(p)} = \sum_{i=p}^{K-1} h_i \circ x_{n-i}^{(i)}.$$

Setting p=0 returns the exact value of $\tilde{y}_n$.

Figure 1:
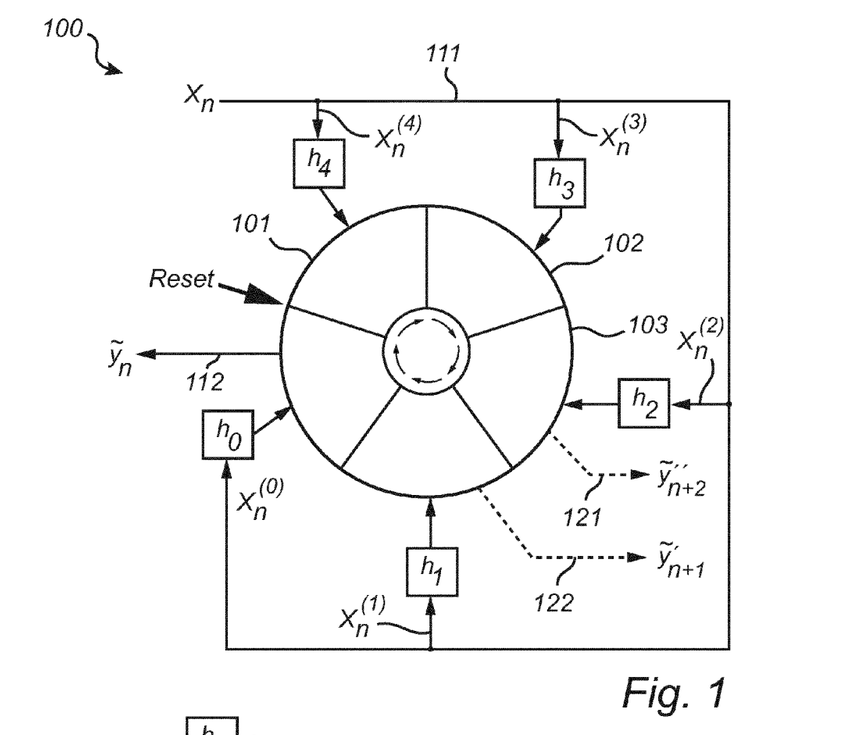
FIGS. 1 and 2 are generalized block diagram of finite impulse response (FIR) filters acting as synthesis filters in audio processing systems.

The filter 100 shown in FIG. 1 includes output buffers to compute the approximate values. In FIG. 1, the buffer is drawn symbolically as a circular buffer, although the circularity is typically implemented by way of pointer addressing (wraparound on increment). The location of the arrow labelled "RESET" suggests that buffer space 105 is to be emptied or overwritten before it receives new data in a subsequent time frame, when it occupies the position of buffer space 101. Windows of N×K input values $x_n^{(i)}$, i=0, 1, …, K−1, are supplied via input line 111 and are added to the buffer spaces 101-105 after component-wise multiplication by the filter coefficient blocks $h_i$. A block of exact filter outputs $\tilde{y}_n$ are obtained at the output line 112. (It is noted that the last output buffer 105 may be replaced by a simple summation circuit, since all data necessary to compute the output are available already at the beginning of that time block in which the youngest input time block is received by the filter. In other words, there is strictly no need to temporarily store (buffer) those values which are to be added to provide the output value.) In the buffers 101-104 located in the counter-clockwise direction from the last output buffer 105, there are approximate values. Two of these approximate values $\tilde{y}'_{n+1}$, $\tilde{y}''_{n+2}$ may be retrieved via shortcut lines 121, 122 by a filter downstream of the filter shown in FIG. 1, so as to reduce a total processing delay.

Figure 2:
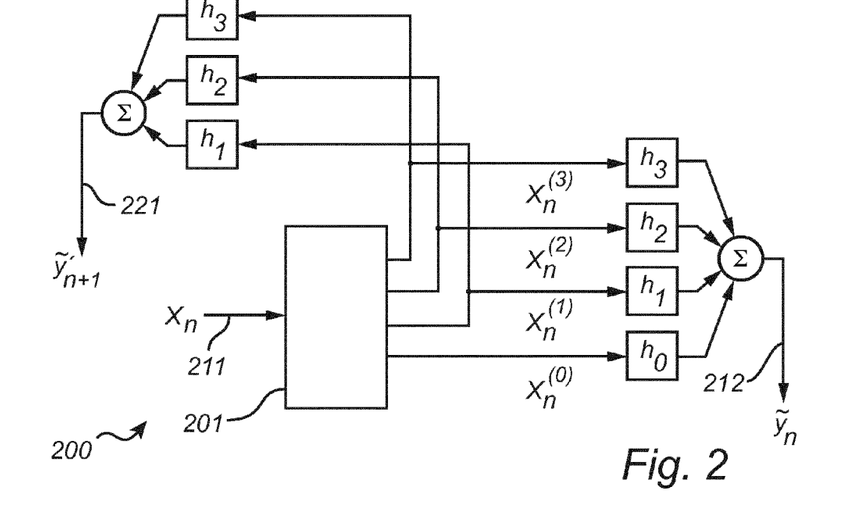
Figure 4:
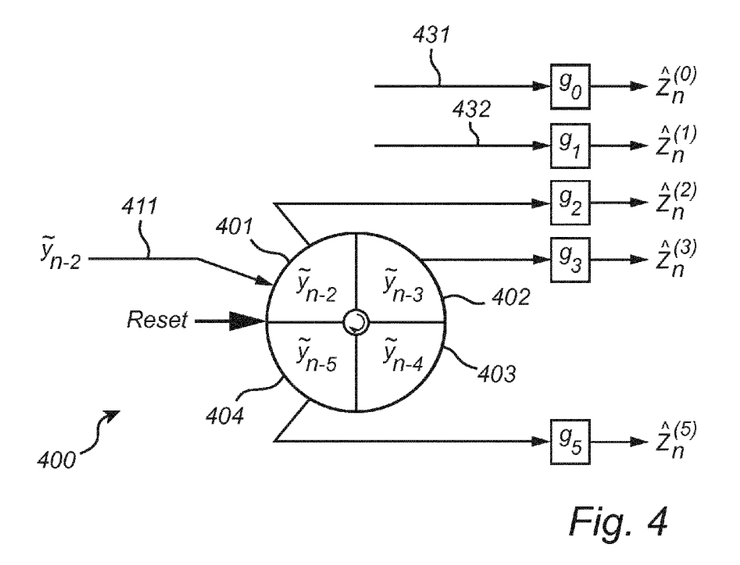
FIGS. 4 and 5 show FIR filters acting as analysis filters in audio processing systems.
Figure 5:
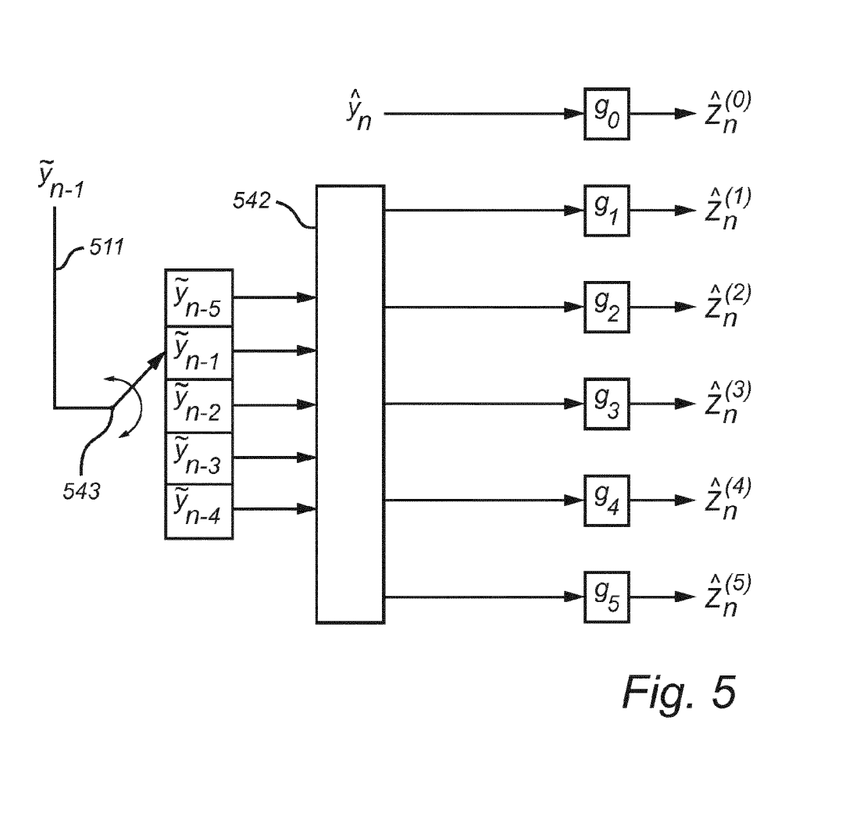

In contrast hereto, the filters in FIGS. 2, 4 and 5 use input buffers in combination with dedicated weighted summers for outputting the approximate values. In the filter shown in FIG. 2, an N×K-sample input window $x_n$ is received over input line 211 and distributed by unit 201 as single blocks $x_n^{(i)}$ to weighted summers. One weighted summer supplies, via output line 212, an exact output time block $\tilde{y}_n$. A further weighted summer supplies an approximate time block $\tilde{y}'_n$ via shortcut line 221. In example embodiments of the invention, an analysis filter connected downstream of the filter shown in FIG. 2 may use both the exact and the approximate time block as inputs to compute an output time block $z_n$.

FIG. 4, shows a filter 400 adapted to be arranged downstream of a filter of the type shown in FIG. 1. The length of the output of the filter is K blocks, $\hat{z}_n = [\hat{z}_n^{(0)} \hat{z}_n^{(1)} \hat{z}_n^{(2)} \ldots \hat{z}_n^{(K-1)}]$. The filter 400 stores a current input blocks $\tilde{y}_{n-2}$ and previous ones $\tilde{y}_{n-3}, \tilde{y}_{n-4}, \tilde{y}_{n-5}$ in buffers 401-404. These are used as inputs to an operation by which the last K−2 blocks of the filter output are obtained. The first two blocks are computed, in this filter 400, on the basis of approximate values $\hat{y}_n, \hat{y}_{n-1}$ supplied via override input lines 431, 432. The approximate values may be equal to the values $\tilde{y}'_n, \tilde{y}''_{n-1}$ discussed above in connection with the filter in FIG. 1, where they are extractable from the shortcut lines 121, 122.

All weighted summers need not include the full set of input lines; for instance, in FIG. 4, coefficient block $g_4$=0, which is why this input line to the weighted summer 421 lacks a corresponding input line from input buffer 403.

Similarly, a filter intended to be always used for deriving an approximate value (as may be the case in the analysis stage) need not include an output line for providing an exact value, as exemplified by FIG. 4.

FIG. 5 shows a filter similar to the one of FIG. 4. Here, the buffer is not circular. Instead, the input line 511 is connected via a selector 543, which is responsible for writing new input data to the buffer location currently holding the least recent data. Downstream of the buffer, a switch 542 forwards the relevant data from buffer locations to different inputs in the weighted summer. The filter shown in FIG. 5 includes one input override line, namely for providing the value $\hat{y}_n$ to be multiplied by coefficient block $g_0$.

The filters in FIGS. 4 and 5 differ with respect to their number of input override lines. A smaller number of input lines may lead to a simpler hardware structure or, in a software implementation, to smaller amount data being moved internally. When one override input line is available, a given approximate value $\tilde{y}''_{n+2}$ is used both to compute both n-labelled outputs in the current time slot and, after buffer shifting, to compute (n+1)-labelled outputs in the subsequent time slot. Using two override input lines is a more sophisticated approach but has benefits for the accuracy. When two override input lines 431, 432 are used, as shown in FIG. 4, the approximate value $\tilde{y}''_{n+2}$ (supplied via the second override input line 432) is refined into the first-order approximate value $\tilde{y}'_{n+2}$ (supplied via the first override input line 431) in the subsequent frame. A principle underlying the invention is to make approximate values from a processing step available prematurely as inputs to a second processing stage located later in the processing path. This principle is applicable to cooperating filter banks also outside the field of audio signal processing. As such, with repeated reference to FIG. 7, an example embodiment provides an arrangement of overlapping filter banks 700, comprising:

a synthesis stage 710 receiving a first signal segmented into time blocks and outputting, based thereon, an intermediate signal; and
 an analysis stage 720 receiving the intermediate signal and outputting, based thereon, a second signal segmented into time frames, wherein the synthesis stage is operable to release an approximate value of the intermediate signal in a time block located $d_1 \geq 1$ time blocks ahead of its output block, which approximate value is computed on the basis of any available time blocks of the first signal; and wherein said approximate value contributes, in the analysis stage, to the second signal.

III. Equivalents, Extensions, Alternatives and Miscellaneous

Even though the invention has been described with reference to specific example embodiments thereof, many different alterations, modifications and the like will become apparent to those skilled in the art after studying this description. The described example embodiments are therefore not intended to limit the scope of the invention, which is only defined by the appended claims.

The invention claimed is:

1. An audio processing system comprising a multiband filter for providing a partially complex frequency-domain representation of a signal, the multiband filter comprising:
 a synthesis stage receiving a first subband range of a first frequency-domain representation of a signal, the first frequency-domain representation being segmented into time blocks and comprising first spectral components representing spectral content of the signal in the first subband range expressed in a first subspace of a multidimensional space, and outputting, based on the first subband range, an intermediate time-domain representation of the signal;
 an analysis stage receiving the intermediate time-domain representation of the signal and outputting, based thereon, a second frequency-domain representation of the signal, the second frequency-domain representation being segmented into time blocks and comprising second spectral components representing spectral content of the signal in the first subband range expressed in a second subspace of the multidimensional space that includes a portion of the multidimensional space not included in the first subspace; and
 a processor receiving the first and second subband ranges of the first frequency-domain representation of the signal and the second frequency-domain representation of the signal and combining these to output a partially complex frequency-domain representation of the signal,
wherein:
 the synthesis stage is operable to release an approximate value of the intermediate time-domain representation in a time block located $d_1 \geq 1$ time blocks ahead of its output block, which approximate value is computed on the basis of any available time blocks of the first frequency-domain representation; and
 said approximate value contributes, in the analysis stage, to a time block of the second frequency-domain representation of the signal.

2. The audio processing system of claim 1, said multiband filter further comprising a transform stage arranged upstream of the multiband filter, said transform stage receiving an input time-domain representation of the signal and outputting the first frequency-domain representation of the signal.

3. The audio processing system of claim 2, wherein the transform stage is one in the group comprising:
 a real-valued QMF analysis bank,
 a pseudo-QMF analysis bank,
 a discrete sine or cosine transform,
 DCT-II,
 DCT-III,
 a modified discrete sine or cosine transform.

4. The audio processing system of claim 1, wherein the synthesis stage comprises a first finite impulse response filter, FIR, with impulse response $[h_0\ h_1\ h_2 \ldots h_{L_s}]$, where coefficient block $h_0 \neq (0, 0, \ldots, 0)$.

5. The audio processing system of claim 4, wherein:
 the FIR filter comprises one or more output buffers for storing approximate values of the intermediate time-domain representation;
 receipt of a new time block of the first frequency-domain representation triggers the FIR filter to increment respective output buffers by the new time block after pre-multiplication by corresponding impulse response coefficient blocks; and
 the synthesis stage permits the analysis stage to access the buffer storing the approximate value of the intermediate time-domain representation in a time block located $d_1$ time blocks ahead of the output block.

6. The audio processing system of claim 5, wherein the approximate value of the intermediate time-domain representation is computed as if any non-available time block of the first frequency-domain representation were zero.

7. The audio processing system of claim 4, wherein the FIR filter comprises:

one or more input buffers for storing recent time blocks of the first frequency-domain representation; and a weighted summer reading out fewer than $L_S+1$ input buffers, applying a subset of the impulse response coefficient blocks and outputting an approximate value of the intermediate time-domain representation in a time block located $d_1$ time blocks ahead of the output block.

8. The audio processing system of claim 5, wherein the computation of the approximate value includes applying impulse response coefficient blocks representing at least 50% of the total impulse response mass.

9. The audio processing system of claim 5, wherein the computation of the approximate value includes applying a sequence of consecutive impulse response coefficient blocks $[h_p\ h_{p+1}\ h_{p+2}\ \ldots\ h_{L_S}]$, where $p \geq 1$, which sequence includes the local absolute maximum of the impulse response.

10. The audio processing system of claim 1, wherein the analysis stage comprises a second finite impulse response filter, FIR, with impulse response $[g_0\ g_1\ g_2\ \ldots\ g_{L_A}]$, where coefficient block $g_0 \neq (0, 0, \ldots, 0)$.

11. The audio processing system of claim 10, wherein:
the second FIR filter comprises one or more output buffers for storing approximate values of the second frequency-domain representation;

receipt, from the synthesis stage, of a new time block of the intermediate time-domain representation triggers the FIR filter to increment a first subset of the output buffers by the new time block after pre-multiplication by corresponding impulse response coefficient blocks; and receipt, from the synthesis stage, of an approximate value of the intermediate time-domain representation triggers the FIR filter to increment a second subset of the output buffers, which includes the output buffer corresponding to the output block, by the approximate value after pre-multiplication by the corresponding impulse response coefficient block.

12. The audio processing system of claim 10, wherein the second FIR filter comprises:
one or more input buffers for storing recent time blocks of the intermediate time-domain representation;

a weighted summer for reading out fewer than $L_A+1$ input buffers, applying a subset of the impulse response coefficient blocks, adding the approximate value after pre-multiplication with the corresponding impulse response coefficient block and outputting this as an output block.

13. The audio processing system of claim 10, wherein the computation of the approximate value includes applying impulse response coefficient blocks representing at least 50% of the total impulse response mass.

14. The audio processing system of claim 10, wherein the computation of the approximate value includes applying a sequence of consecutive impulse response coefficient blocks $[g_p\ g_{p+1}\ g_{p+2}\ \ldots\ g_{L_S}]$, where $p \geq 1$, which sequence includes the local absolute maximum of the impulse response.

15. The audio processing system of claim 1, further comprising a first delay line receiving a second subband range of the first frequency-domain representation of the signal and synchronizing the first frequency-domain representation with the second frequency-domain representation of the signal.

16. The audio processing system of claim 1, further comprising a second delay line receiving a first subband range of the first frequency-domain representation of the signal and synchronizing the first subband of the first frequency-domain representation with the second frequency-domain representation.

17. The audio processing system of claim 15, wherein at least one of the delay lines are configured to achieve the synchronization by performing one of the following operations:
  a) temporarily storing its received signal;
  b) time stamping its received signal;
  c) forming a data structure comprising a time block of its received signal and a synchronous time block of the other signal included in the synchronization.

18. The audio processing system of claim 1, wherein the first subband range is a relatively lower frequency range and the second subband range is a relatively upper frequency range.

19. The audio processing system of claim 1, wherein the system is an audio encoder or an audio decoder.

20. An audio processing method for providing a partially complex frequency-domain representation of a signal, comprising the steps:
  receiving a first subband range of a first frequency-domain representation of a signal, the first frequency-domain representation being segmented into time blocks and comprising first spectral components representing spectral content of the signal in the first subband range expressed in a first subspace of a multidimensional space;
  generating, based on the first subband range, an intermediate time-domain representation of the signal;
  generating, based on the intermediate time-domain representation a second frequency-domain representation of the signal, the second frequency-domain representation being segmented into time blocks and comprising second spectral components representing spectral content of the signal in the first subband range expressed in a second subspace of the multidimensional space that includes a portion of the multidimensional space not included in the first subspace;
  synchronizing the first frequency-domain representation with the second frequency-domain representation of the signal; and
  combining the first and second subband ranges of the first frequency-domain representation of the signal and the second frequency-domain representation of the signal to output a partially complex frequency-domain representation of the signal,
  wherein the step of generating the second frequency-domain representation includes using an approximate value of the intermediate time-domain representation in a time block located $d_1 \geq 1$ time blocks ahead of the earliest time block in which a set of time blocks of the first frequency-domain representation, sufficient for an exact computation of the same time block, would have been available, which approximate value is computed on the basis of any available time blocks of the first frequency-domain representation.

21. A data carrier comprising computer-readable instructions for performing the method of claim 20.

* * * * *